United States Patent
Orihashi

(10) Patent No.: US 10,050,327 B2
(45) Date of Patent: Aug. 14, 2018

(54) WAVEGUIDE CONVERTER INCLUDING A WAVEGUIDE AND ANTENNA TERMINATED BY A TERMINAL WAVEGUIDE HAVING AN ADJUSTABLE CONDUCTOR PLATE

(71) Applicant: NEC Corporation, Tokyo (JP)

(72) Inventor: Naoyuki Orihashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 15/129,243

(22) PCT Filed: Feb. 27, 2015

(86) PCT No.: PCT/JP2015/001051
§ 371 (c)(1),
(2) Date: Sep. 26, 2016

(87) PCT Pub. No.: WO2015/145989
PCT Pub. Date: Oct. 1, 2015

(65) Prior Publication Data
US 2017/0104258 A1 Apr. 13, 2017

(30) Foreign Application Priority Data
Mar. 27, 2014 (JP) .................. 2014-066040

(51) Int. Cl.
*H01P 5/107* (2006.01)
*H01P 5/08* (2006.01)
(Continued)

(52) U.S. Cl.
CPC .............. *H01P 5/107* (2013.01); *H01P 1/062* (2013.01); *H01P 5/08* (2013.01); *H01P 11/001* (2013.01); *H01P 11/002* (2013.01); *H03H 7/38* (2013.01)

(58) Field of Classification Search
CPC ........ H01P 5/107; H01P 5/103; H01P 11/001; H01P 11/002
(Continued)

(56) References Cited

U.S. PATENT DOCUMENTS 2,829,348 A * 4/1958 Kostriza et al. ........ H01P 5/107
333/238
3,638,148 A * 1/1972 Hailford et al. ........ H01P 3/081
333/12
(Continued)

FOREIGN PATENT DOCUMENTS

EP 391596 A2 10/1990
JP 59-29803 2/1984
(Continued)

OTHER PUBLICATIONS

International Search Report corresponding to PCT/JP2015/001051, dated Apr. 28, 2015, 1 page.
(Continued)

*Primary Examiner* — Benny Lee
(74) *Attorney, Agent, or Firm* — Wilmer Cutler Pickering Hale and Dorr LLP

(57) ABSTRACT

Impedance optimization is difficult in microwave-band waveguide converters. To solve that problem, this waveguide converter is provided with the following: a waveguide provided so as to introduce microwaves to an antenna that performs input and output in a planar microwave circuit; a terminal waveguide that faces the aforementioned waveguide with the antenna interposed therebetween and connects to said waveguide so as to terminate same; and a conductor plate mounted so as to face the antenna. The conductor plate is electrically connected to at least part of the inside wall of the terminal waveguide.

6 Claims, 11 Drawing Sheets

(51) Int. Cl.
*H01P 1/06* (2006.01)
*H03H 7/38* (2006.01)
*H01P 11/00* (2006.01)

(58) Field of Classification Search
USPC .......................................................... 333/26
See application file for complete search history.

(56) References Cited

U.S. PATENT DOCUMENTS 4,144,506 A * 3/1979 McCammon et al. .. H01P 5/103
333/26
4,901,040 A 2/1990 Ahlborn et al.

FOREIGN PATENT DOCUMENTS

| | | |
|---|---|---|
| JP | S59-117804 A | 7/1984 |
| JP | H02-021906 | 2/1990 |
| JP | H02-288501 A | 11/1990 |
| JP | 2004-254223 A | 9/2004 |
| JP | 2011-199692 A | 10/2011 |

OTHER PUBLICATIONS

Written Opinion of International Searching Authority corresponding to PCT/JP2015/001051 with English translation, dated Apr. 28, 2015, 5 pages.

* cited by examiner

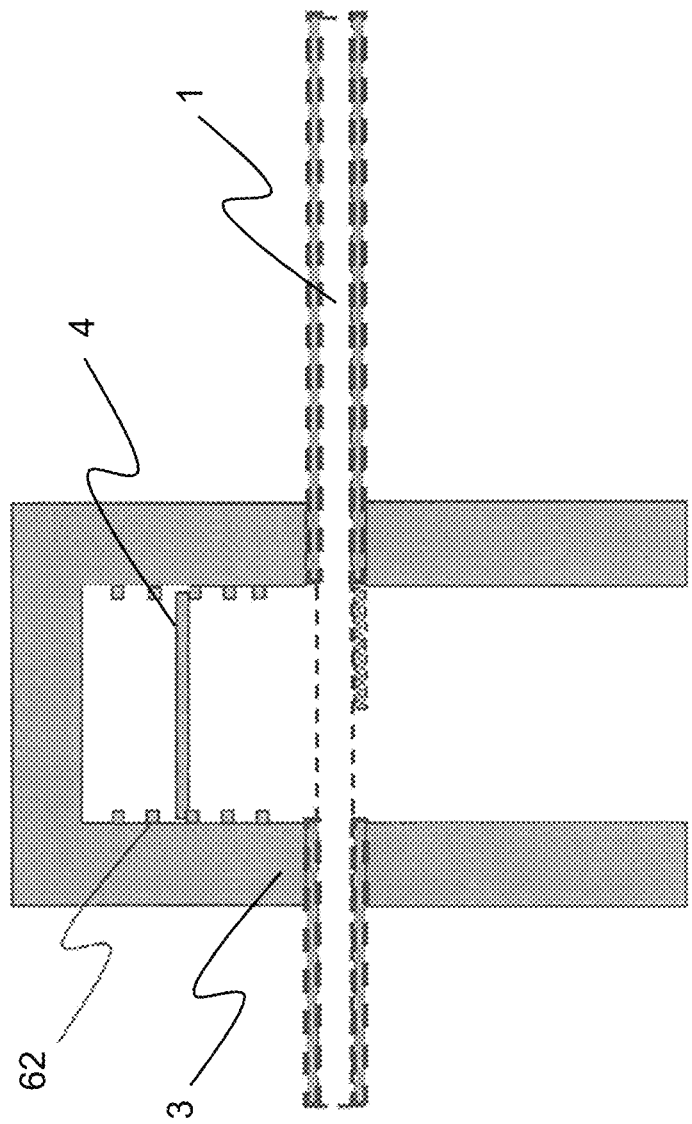

78

78

79

79

WAVEGUIDE CONVERTER INCLUDING A WAVEGUIDE AND ANTENNA TERMINATED BY A TERMINAL WAVEGUIDE HAVING AN ADJUSTABLE CONDUCTOR PLATE

CROSS-REFERENCE TO RELATED APPLICATIONS

This application is a national stage application of International Application No. PCT/JP2015/001051 entitled "WAVEGUIDE CONVERTER AND WAVEGUIDE CONVERSION METHOD," filed on Feb. 27, 2015, which claims the benefit of the priority of Japanese Patent Application No. 2014-066040 filed on Mar. 27, 2014, the disclosures of each of which are hereby incorporated by reference in their entirety.

TECHNICAL FIELD

The present invention relates to a waveguide converter and a waveguide conversion method, particularly a waveguide conversion method which is able to adjust output impedance.

BACKGROUND ART

A waveguide converter is a converter placed between a waveguide which is a microwave transmission line and a planar line like a strip line which is also the microwave transmission line. For example, it is used widely when an antenna or a waveguide is connected to a high-frequency wave circuit. The reason is that a waveguide which is a hollow metal tube is generally used for input and output with the outside of a wireless communication device, while a distributed constant line or a coaxial line like a micro-strip line is generally used in a high-frequency wave circuit within the wireless communication device. That is because a converter which performs mode conversion is required for connection between two kinds of microwave transmission lines each having a different transmission mode. Examples of such waveguide converters are described in following Patent Literatures 1 to 3.

For example, Patent Literature 1 (i.e. PTL 1) describes a related waveguide converter in which a probe is arranged in a direction parallel to an electric field of microwaves transmitting in a waveguide and a movable screw 78 which adjusts a distance from the probe to a short-circuit face of the waveguide is placed, as shown in FIG. 8A and FIG. 8B. FIG. 8A is a top view of the waveguide converter and FIG. 8B is a cross-sectional view of the waveguide converter. A reference label "D" in FIG. 8B indicates the distance from a probe 25 to the short-circuit face of a waveguide 20. In the related waveguide converter, setting of a length and a thickness of the probe and adjustment of the distance by the movable screw enables to make impedance matching between the waveguide and an amplifier.

Patent Literature 2 (i.e. PTL 2) describes a waveguide converter with another structure in which a strip antenna is mounted on a substrate, a short-circuit mechanism portion in which an elliptic concave portion whose height is equivalent to a width of an inner shape of a waveguide is formed in a carrier which is located on a back of the antenna, and an adjustment screw 79 is placed in a center of the elliptic concave portion, as shown in FIG. 9A and FIG. 9B. FIG. 9A is a top view illustrating another structure of the waveguide converter, and FIG. 9B is a cross-sectional view illustrating another structure of the waveguide converter. In the related waveguide converter, manufacturing of the short-circuit mechanism portion and setting of an electrical length are easily performed. Patent Literature 3 (i.e. PTL 3) describes a related waveguide and a micro-strip line converter. In the PTL 3, a male screw is provided on an adjusting plate internally fitted in the waveguide, and a setscrew for fixing a spacer and the adjusting plate is combined. Thereby, a position adjusting portion of the adjusting plate of the waveguide terminating portion can be made smaller than an outer diameter of a chassis.

CITATION LIST

Patent Literature

[PTL 1] Japanese Patent Application Laid-Open No. 2004-254223
[PTL 2] Japanese Patent Application Laid-Open No. 59-117804
[PTL 3] Japanese Utility Model Application Laid-Open No. 02-021906

SUMMARY OF THE INVENTION

Technical Problem

The related waveguide converters described in Patent Literatures 1 and 2 have the following problems. As mentioned above, the waveguide converter relays a waveguide that propagates microwaves and a high-frequency circuit that transmits and receives the microwaves. When the high-frequency wave circuit transmits and receives the microwaves transmitting in the waveguide, the waveguide converter is probably placed at a first stage of an output tip or an input tip of the high-frequency wave circuit. For example, if the high-frequency wave circuit is a receiving circuit of the wireless communication device, the waveguide converter is placed in a previous position of a LNA (LOW Noise Amplifier). It is required to reduce a NF (Noise Figure) in the receiving circuit like the LNA, or the like, as much as possible, and output impedance of an electric element which is placed at a previous stage of the receiving circuit has to be adjusted so that NF is minimized. It is necessary to optimally adjust (i.e. match) the output impedance of the waveguide converter corresponding to the electric element at a previous stage.

A method of output impedance matching in the waveguide converter is explained here. At the time of design, the design is necessarily performed so that impedance is matched. During manufacturing, however, the impedance may be changed because of a component manufacturing error, a component assembling error, or the like. Consequently NF in the receiving circuit is deteriorated. When NF is deteriorated during manufacturing, generally an electric constant of an electrical element which is placed in a previous position of an IC (Integrated Circuit) on a printed wiring board is changed, or an adjustment pattern is processed, as a countermeasure. However, since the electric constant change of the electric element on the printed wiring board or pattern adjustment requires disassembling of a device, a step for adjustment is necessary. A waveguide converter is desirable, having an adjustment mechanism for an electronic characteristic in which an easy method which is performed without disassembling after assembling the device. Patent Literatures 1 and 2 disclose solutions to the problem. However, impedance adjustment means in the related waveguide converter described in Patent Literatures 1 and 2 does not make sufficient impedance matching. That is because unnecessary resonance occurs due to wrap-arounds of microwaves at a screw portion for adjustment.

As mentioned above, a conversion characteristic of the waveguide converter placed in a previous position of LNA strongly affects a receiving characteristic of the receiving circuit, and therefore the waveguide converter requires optimum impedance adjustment. However, optimum impedance adjustment of the related waveguide converter is difficult.

An object of the invention is to provide a waveguide converter and a waveguide conversion method which solve the problem in which optimum impedance adjustment is difficult in the waveguide converter for a microwave band.

SOLUTION TO THE PROBLEM

The waveguide converter of the invention includes a waveguide provided so as to introduce microwaves to an antenna that performs input and output in a planar microwave circuit, a terminal waveguide that faces the aforementioned waveguide with the antenna interposed therebetween and connects to the waveguide so as to terminate the waveguide, and a conductor plate mounted so as to face the antenna. The conductor plate is electrically connected to at least part of the inside wall of the terminal waveguide.

The waveguide conversion method of the invention is realized by including the steps of introducing microwaves toward an antenna performing input and output in a planar microwave circuit, terminating the microwaves that pass through the antenna by a conductor plate and reflecting the microwaves, and making a distance between the conductor plate and the antenna variable.

ADVANTAGEOUS EFFECTS OF THE INVENTION

According to the waveguide converter and the waveguide conversion method of the present invention, optimum impedance adjustment for a waveguide converter is performed.

BRIEF DESCRIPTION OF THE DRAWINGS

FIG. 4 is a cross-sectional view illustrating another structure of the waveguide converter of the third exemplary embodiment of the invention;

DETAILED DESCRIPTION OF THE EMBODIMENTS

Figure 1:
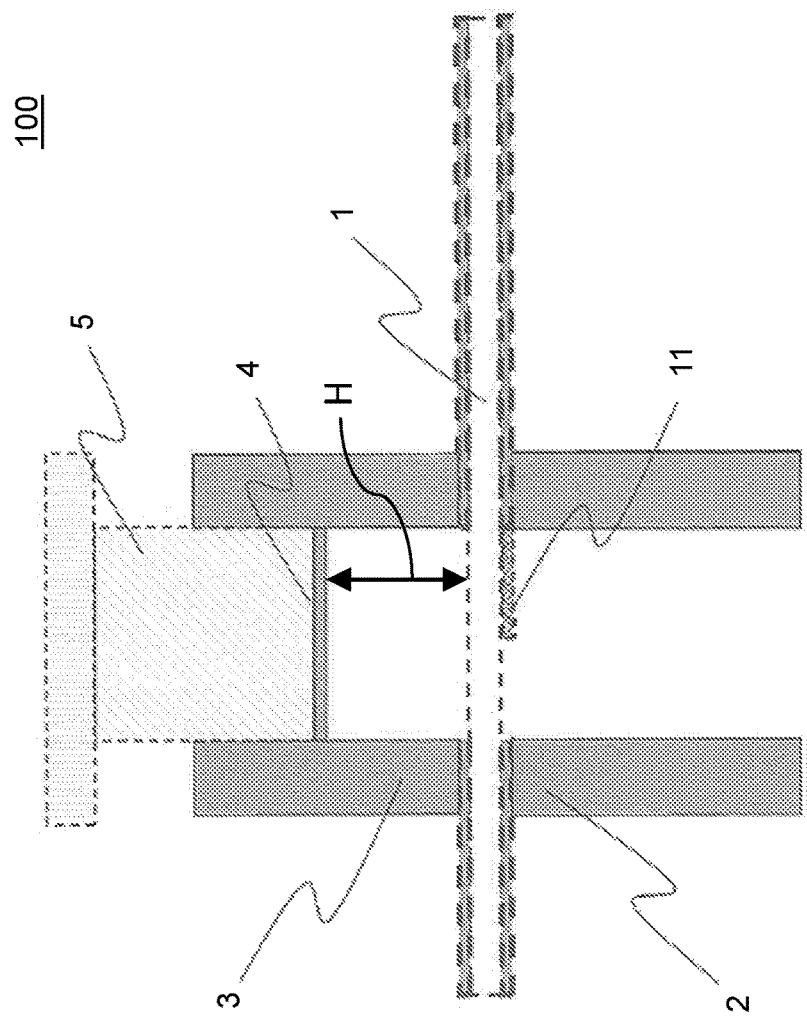
FIG. 1 is a cross-sectional view illustrating a structure of a waveguide converter of a first exemplary embodiment of the invention.

Embodiments for performing the invention are explained by referring to drawings. In following descriptions, elements having the same function have the same reference numeral, and explanation thereof may be omitted.

(First Exemplary Embodiment)

FIG. 1 is a cross-sectional view illustrating a structure of a waveguide converter of a first exemplary embodiment of the invention. A waveguide converter 100 of the exemplary embodiment includes following constituent elements. The converter 100 includes a waveguide 2 configured to introduce microwaves to an antenna 11 performing input and output of microwaves, a terminal waveguide 3 which is opposed to the waveguide 2 across the antenna 11 and terminates by being connected to the waveguide 2, and a conductor plate 4 configured to face the antenna 11.

A printed wiring board 1 is sandwiched between the waveguide 2 and the terminal waveguide 3 on the both sides thereof. Most of the front side and the other side of the printed wiring board is covered by conductor. The printed wiring board 1, however, includes a part which is not covered by the conductor. The antenna 11 is formed of a conductor pattern at the part. The antenna 11 is connected to a transmission line on the printed wiring board 1, for example, a micro strip line.

The conductor plate 4 may be connected to an adjustment mechanism 5 which moves it up and down relative to the antenna 11. Thereby the conductor plate 4 enables to change a distance to the printed wiring board 1 including the antenna 11. It is noted that the conductor plate 4 electrically comes in direct contact with an inside wall of the terminal waveguide 3 without interposing the adjustment mechanism 5. That is, high-frequency wave grounding is performed at the place where the conductor plate 4 is located. The inside walls of the conductor plate 4 and the terminal waveguide 3 do not have to be in direct contact at all four sides around the conductor plate 4. Two sides facing each other in the periphery of the conductor plate 4 have only to come in contact with the inside wall of the terminal waveguide 3. In the structure, since the conductor plate 4 functions as a short-circuit end, a position of a short-circuit face (not shown) in the terminal waveguide 3 is effectively changed. Since microwave leakage from the conductor plate to the short-circuit face is reduced since the conductor plate 4 is the short-circuit end, parasitic oscillation generated between the conductor plate and the short-circuit face is suppressed.

A structure of the adjustment mechanism 5 adjusting a distance between the conductor plate 4 and the printing wiring board 1 is described. The adjustment mechanism 5 includes a structure in which the conductor plate 4 is mounted on a block-shaped end portion which slides on the inside wall of the terminal waveguide 3, and the mechanism 5 linearly moves the conductor plate 4 in a direction closer to and away from the printed wiring board 1. In addition to the above mentioned continuous distance adjustment, semi-fixing adjustment, an adjustment having discrete adjustment positions, or the like, is available. Effects brought by the distance adjustment are explained below.

Figure 7:
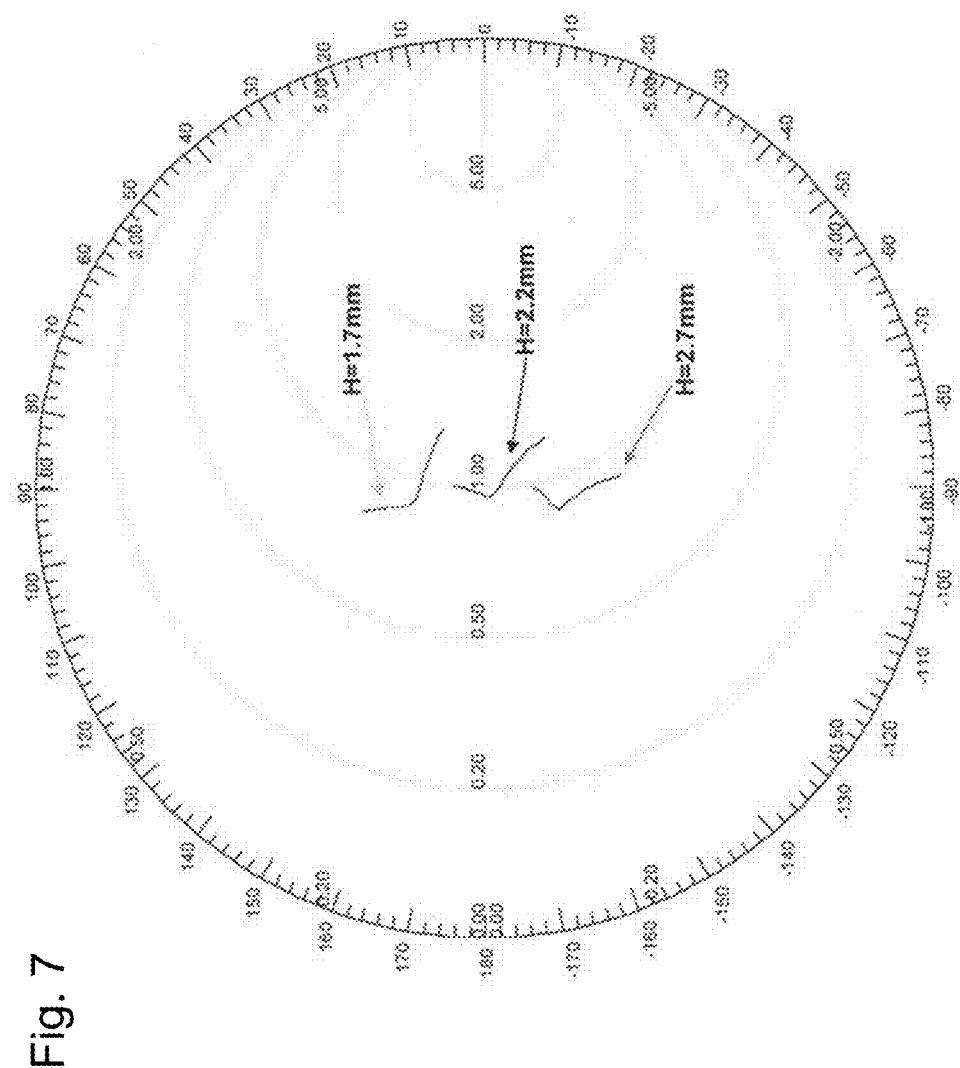
FIG. 7 is a diagram explaining an effect of the waveguide converter of the first exemplary embodiment of the invention.
Figure 8A:
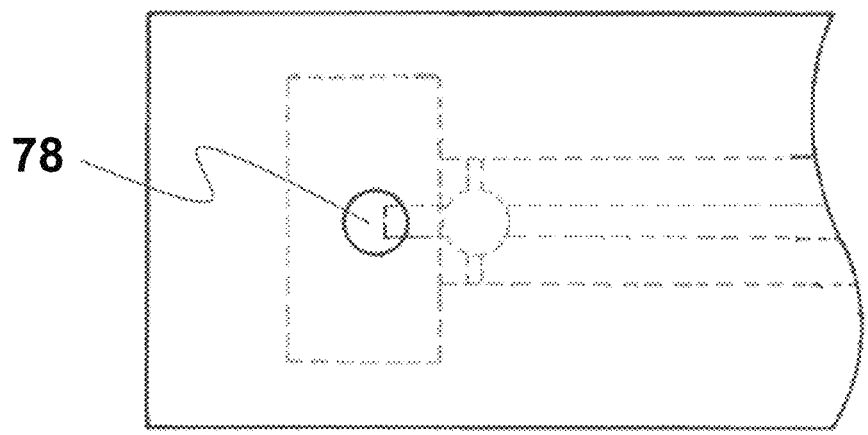
FIG. 8A is a top view illustrating a structure of a related waveguide converter.
Figure 8B:
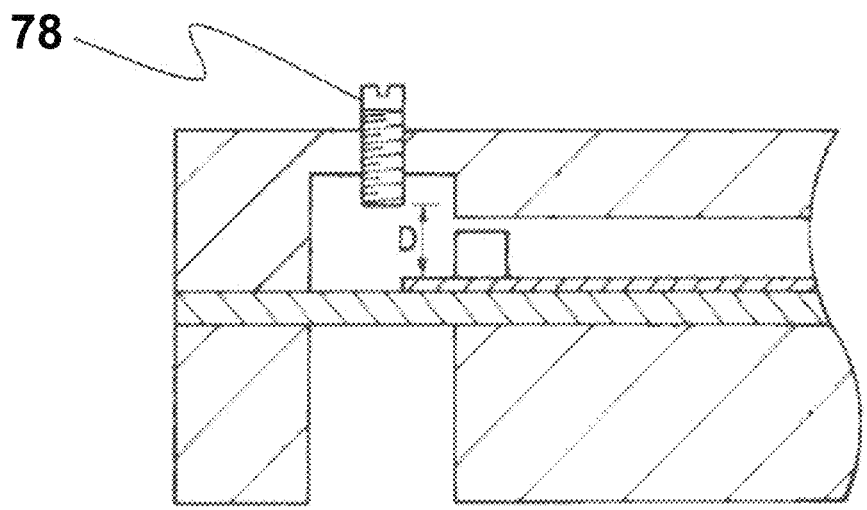
FIG. 8B is a cross-sectional view illustrating a structure of the related waveguide converter.
Figure 9A:
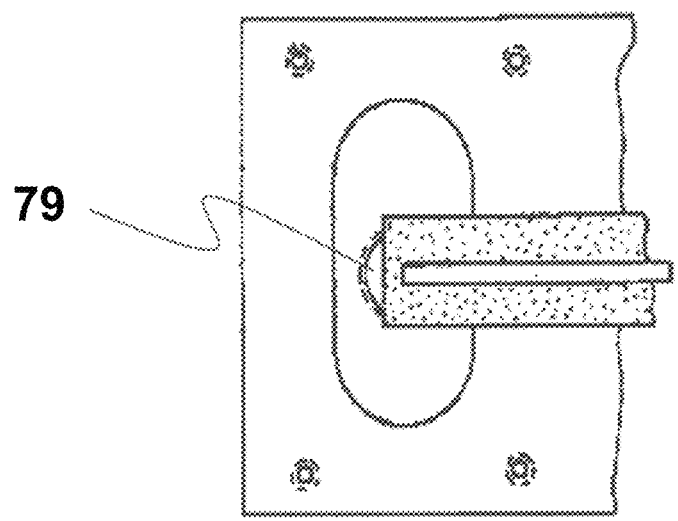
FIG. 9A is a top view illustrating another structure of a related waveguide converter.
Figure 9B:
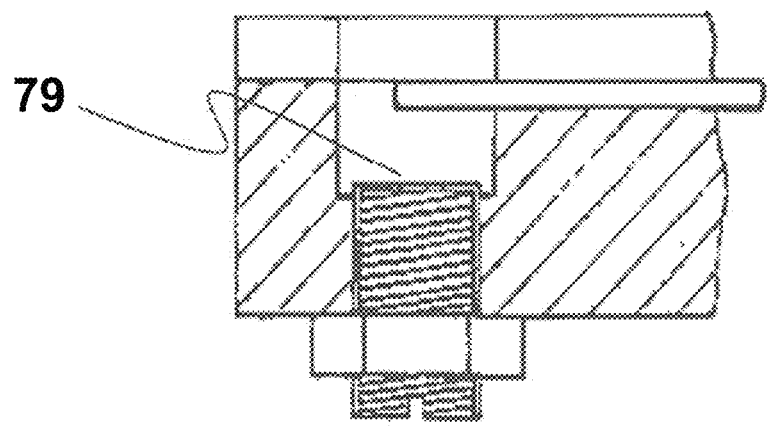
FIG. 9B is a cross-sectional view illustrating another structure of the related waveguide converter.

FIG. 7 is a diagram explaining effects of the waveguide converter of the first exemplary embodiment of the invention depicted in FIG. 1. The Smith chart represents change of impedance of the waveguide converter which is generated when a position of a short-circuit face in the terminal waveguide 3 changes and a distance H (FIG. 1) between the short-circuit face and the printed wiring board 1 changes. Specifically, in three stage of H=1.7 mm, H=2.2 mm, and H=2.7 mm, reflection coefficients of the waveguide converter with respect to microwaves in a predetermined frequency range are illustrated. As shown in FIG. 7, tracks of impedance change on the Smith chart change, and it is confirmed that an impedance characteristic is improved in the case of H=2.2 mm. When the distance between the short-circuit face composed of the conductor plate 4 and the printed wiring board is changed, increase of the reflection coefficient caused by mismatching of impedance is prevented, and the impedance characteristic is improved.

(Effect)

As described above, in the waveguide converter of the exemplary embodiment, optimum impedance adjustment of the waveguide converter is performed.

(Second Exemplary Embodiment)

(Structure)

Figure 2:
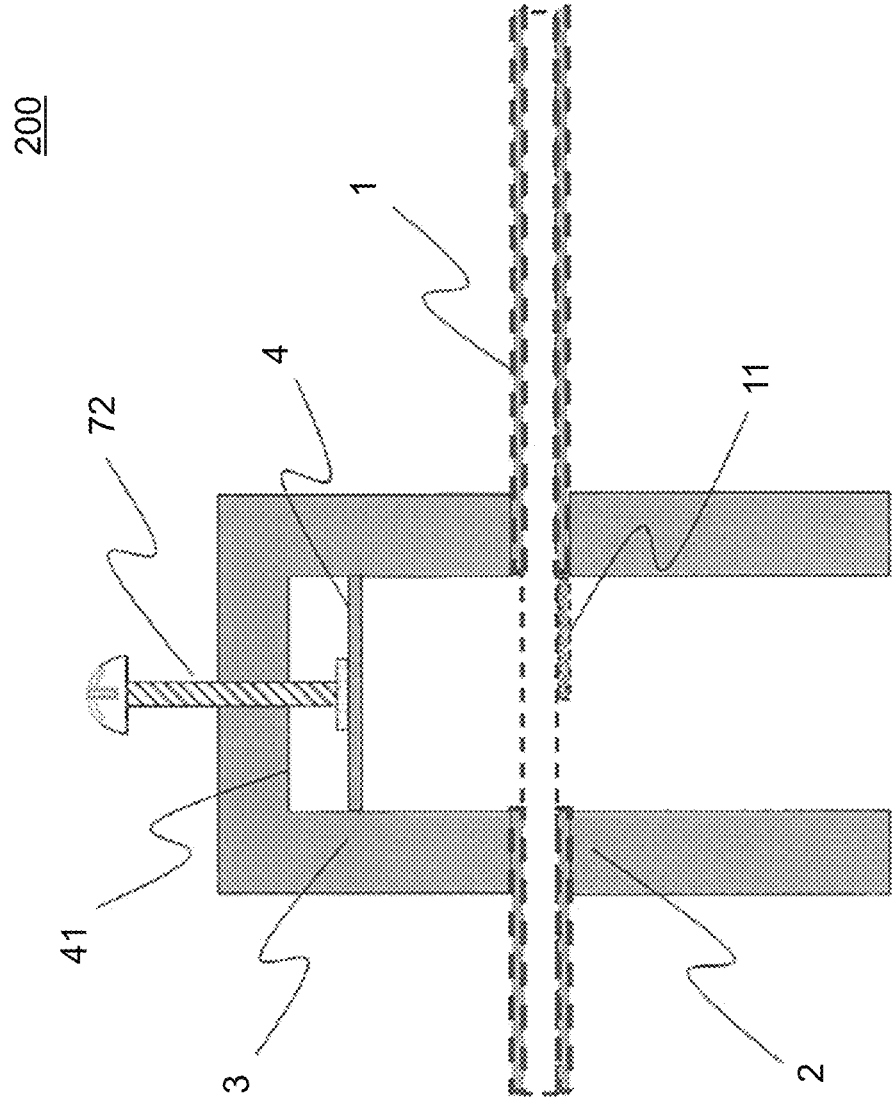
FIG. 2 is a cross-sectional view illustrating a structure of a waveguide converter of a second exemplary embodiment of the invention.

FIG. 2 is a cross-sectional view illustrating a structure of a waveguide converter of a second exemplary embodiment of the invention. A structure of a waveguide converter 200 of the exemplary embodiment differs in a mechanism adjusting a position of the conductor plate 4 from the structure of the waveguide converter 100 of the first exemplary embodiment. A semi-fixing mechanism 72 which is the adjustment mechanism of the exemplary embodiment includes a mechanism which changes distance adjustment by linear movement into adjustment by rotational movement. The other structures in the waveguide converter 200 of the exemplary embodiment are the same as the structures of the waveguide converter 100.

The semi-fixing mechanism 72 is explained in detail. The short-circuit face 41 which is located at an end of the terminal waveguide 3 includes a mechanism which moves the conductor plate 4 up and down relative to the antenna 11. The mechanism which moves the conductor plate 4 up and down relative to the antenna 11 may be a mechanism in which a screw is inserted in a screw hole formed in the terminal waveguide 3, and the conductor plate 4 is mounted at a tip of the screw. The mechanism moves the conductor plate 4 forming a short-circuit end up and down relative to the antenna 11 and adjusts a distance between the conductor plate 4 and the printed wiring board 1.

(Operation)

High frequency signals enter the printed wiring board 1 through the waveguide 2. A part of the high frequency signals which enter the printed wiring board 1 directly enter the antenna 11 which is formed in an opening of the printed wiring board 1, and the other signals pass through the printed wiring board 1 and the terminal waveguide 3, and are reflected by the conductor 4, i.e. the short-circuit end to enter the antenna 11 on the printed wiring board 1. When there is the conductor board 4, the conductor board 4 becomes the short circuit face, and the signals cannot enter between the conductor board 4 and the upper end (terminal surface) of the terminal wave guide 3. Therefore, the area does not form an electrical path in microwave. The terminal waveguide 3 has a function similar to a function of a stub circuit of a high frequency wave circuit. The distance between the conductor plate 4 and the printed wiring board 1 corresponds to a stub length and determines a frequency characteristic of the waveguide converter 200. The semi-fixing mechanism 72 changes the distance the printed wiring board 1 and the conductor plate 4 forming the short-circuit face and adjusts output impedance of the waveguide converter 200.

(Effect)

As described above, in the waveguide converter of the exemplary embodiment, optimum impedance adjustment of the waveguide converter is performed.

(Third Exemplary Embodiment)

Figure 3:
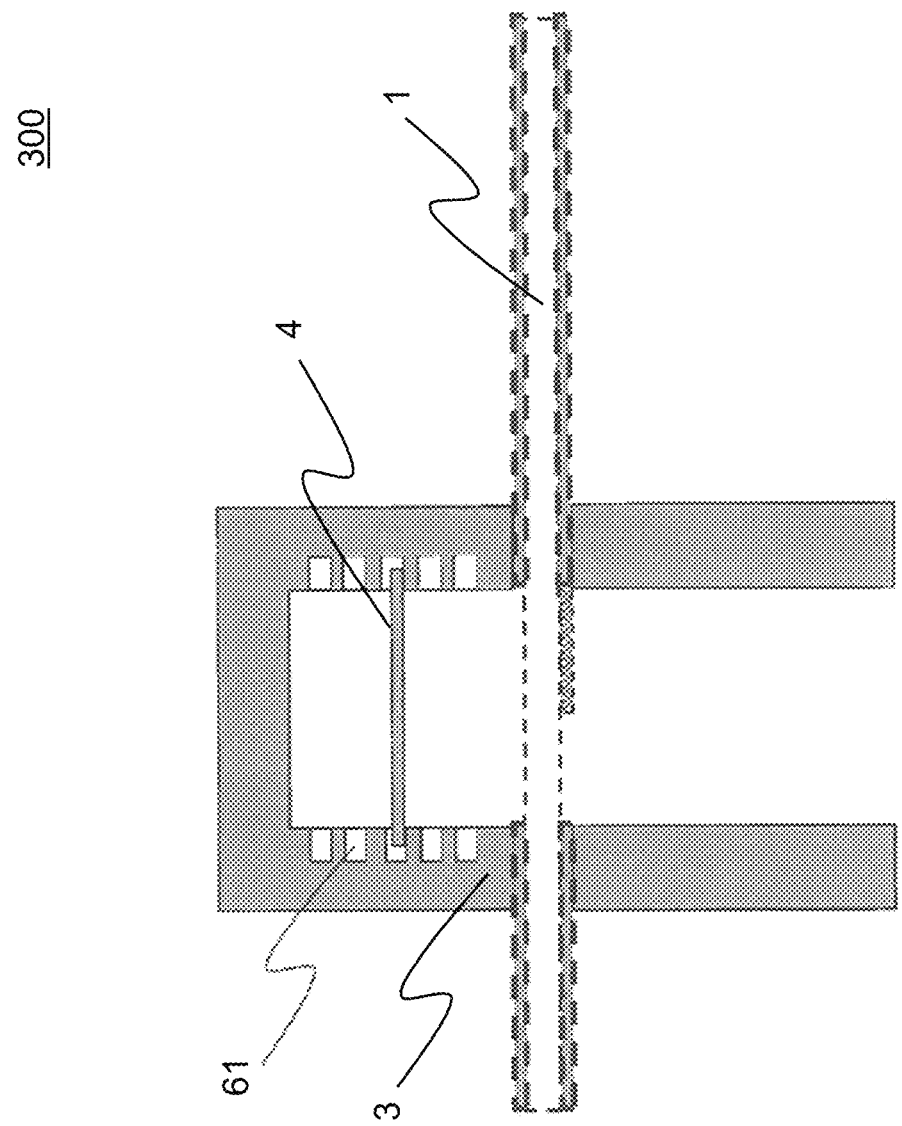
FIG. 3 is a cross-sectional view illustrating a structure of a waveguide converter of a third exemplary embodiment of the invention.

FIG. 3 is a cross-sectional view illustrating a structure of a waveguide converter of a third exemplary embodiment of the invention. A structure of a waveguide converter 300 of the exemplary embodiment differs in a mechanism adjusting a position of the conductor plate 4 from the structure of the waveguide converter 100 of the first exemplary embodiment. An engagement mechanism 61, i.e. the adjustment mechanism of the exemplary embodiment is a plurality of grooves which are formed on the inside wall of the terminal waveguide 3, and are concave portions in the cross-sectional view of FIG. 3. The engagement mechanism 61 changes the distance between the conductor plate 4 and the printed wiring board 1 in a step-by-step manner. The other structures in the waveguide converter 300 of the exemplary embodiment are equivalent to the structures of the waveguide converter 100.

The waveguide converter 300 has a structure in which the conductor plate is engaged with the inside wall of the terminal waveguide 3 parallel to the printed wiring board 1. The structure of the waveguide converter 300 is different from the adjustment mechanism of the first and the second exemplary embodiments in which the conductor plate moves up and down relative to the antenna 11. Specifically a plurality of grooves are formed on both side faces on the short edge side or the long edge side of the terminal waveguide 3 and the conductor plate 4 is inserted in any one of the grooves to lock the conductor plate 4. Since the distance between the conductor plate 4 which functions as the short-circuit face and the printed wiring board 1 is changed, output impedance of the waveguide converter is adjusted, similarly to the first exemplary embodiment.

The conductor plate 4 is desirably connected to a circumference of the cavity in the terminal waveguide 3. If the conductor plate 4 is electrically connected to a short edge direction of the terminal waveguide 3, about half of the long edge direction of the cavity in the terminal waveguide 3 has only to be covered by the conductor plate 4.

(Effect)

As described above, in the waveguide converter 300 of the exemplary embodiment, by optionally choosing the groove engaging the conductor plate 4, the distance between the conductor plate 4 forming the short-circuit end and the printed wiring board 1 is finely changed. Therefore, output impedance of the waveguide converter 300 is finely adjusted and optimum impedance adjustment for the waveguide converter is performed.

FIG. 4 is a cross-sectional view illustrating another structure of the waveguide converter of the third exemplary embodiment of the invention. A waveguide converter 310 with another structure thereof includes a plurality of convex portions as an engagement mechanism 62, i.e. the adjustment mechanism, which are arranged on the inside wall of the terminal waveguide 3. The conductor plate 4 is engaged by inserting the conductor plate 4 in any one of the convex portions. A structure is provided, in which the convex portion holds the conductor plate 4. The engagement mechanism 62 with such structure changes the distance between the conductor plate 4 and the printed wiring board 1 in stages. The waveguide converter 310 therefore obtains operations and effects similar to those of the waveguide converter 300 depicted in FIG. 3.

(Fourth Exemplary Embodiment)

Figure 5A:
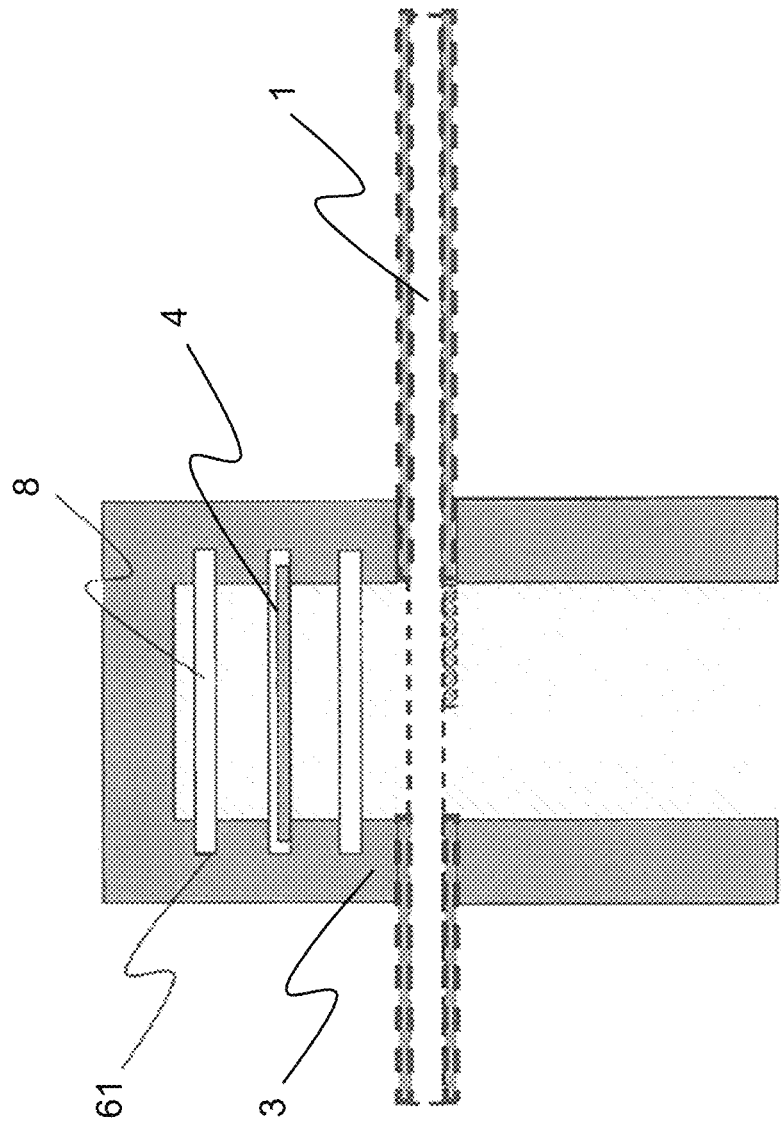
FIG. 5A is a cross-sectional view on a short edge side illustrating a structure of a waveguide converter of a fourth exemplary embodiment of the invention.
Figure 5B:
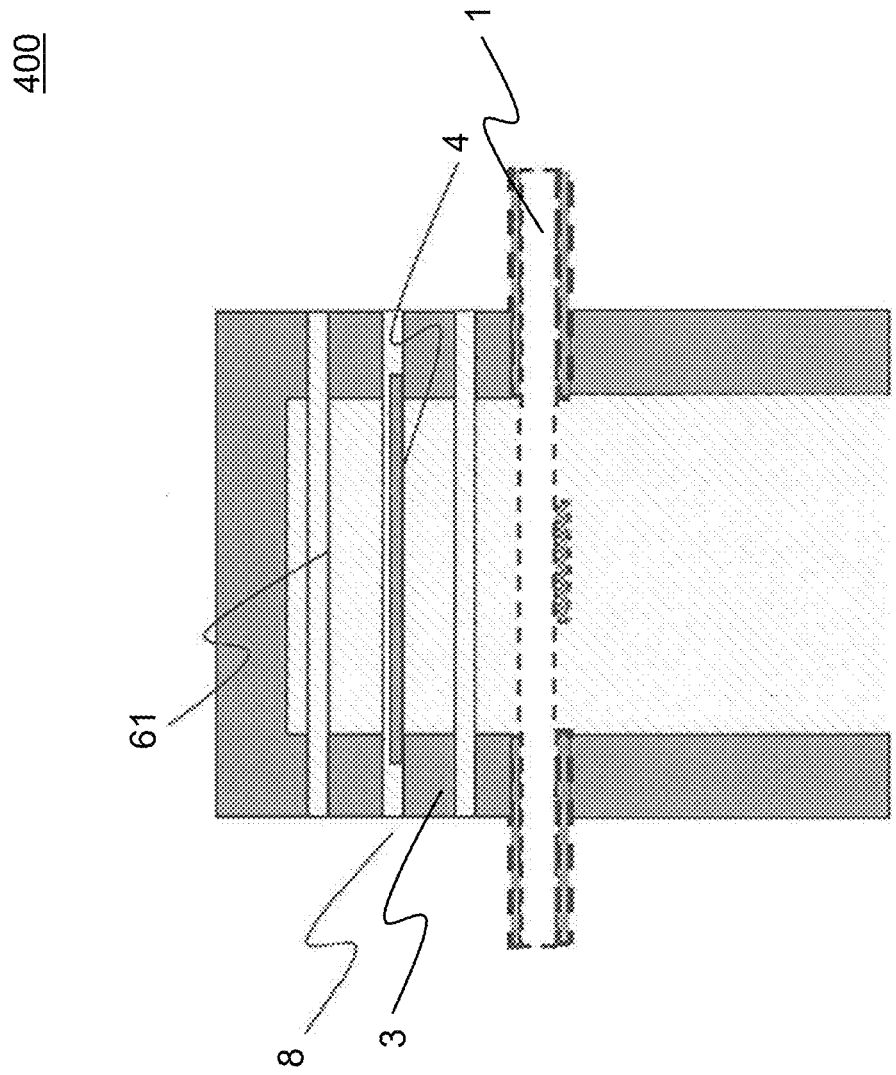
FIG. 5B is a cross-sectional view on a long edge side illustrating a structure of the waveguide converter of the fourth exemplary embodiment of the invention.

FIGS. 5A and/or 5B is a cross-sectional view illustrating a structure of a waveguide converter of a fourth exemplary embodiment of the invention. FIG. 5A is a cross-sectional view on the short edge side and FIG. 5B is a cross-sectional view on the long edge side. A structure of a waveguide converter 400 of the exemplary embodiment differs in that a slit 8 which is a long and narrow opening is formed in the terminal waveguide 3 from the structure of the waveguide converter 300 of the third exemplary embodiment. The waveguide converter 400 of the exemplary embodiment has a structure in which the slit 8 is arranged at the same position as the position of the groove 61 which is formed on a short edge side or a long edge side of the terminal waveguide 3 and arranged on a side face vertical to the side face on which the grooves 61 are formed. The conductor plate 4 is inserted from the slit 8 into the groove 61 which is formed on the both inside walls of the terminal waveguide 3. Finally, the conductor plate 4 is inserted in any one of the grooves to be engaged. The engagement mechanism 61 further including the slit 8 changes the distance between the conductor plate 4 and the printed wiring board 1 in stages. The waveguide converter 400 therefore obtains operations and effects similar to those of the waveguide converter 300.

(Fifth Exemplary Embodiment)

Figure 6A:
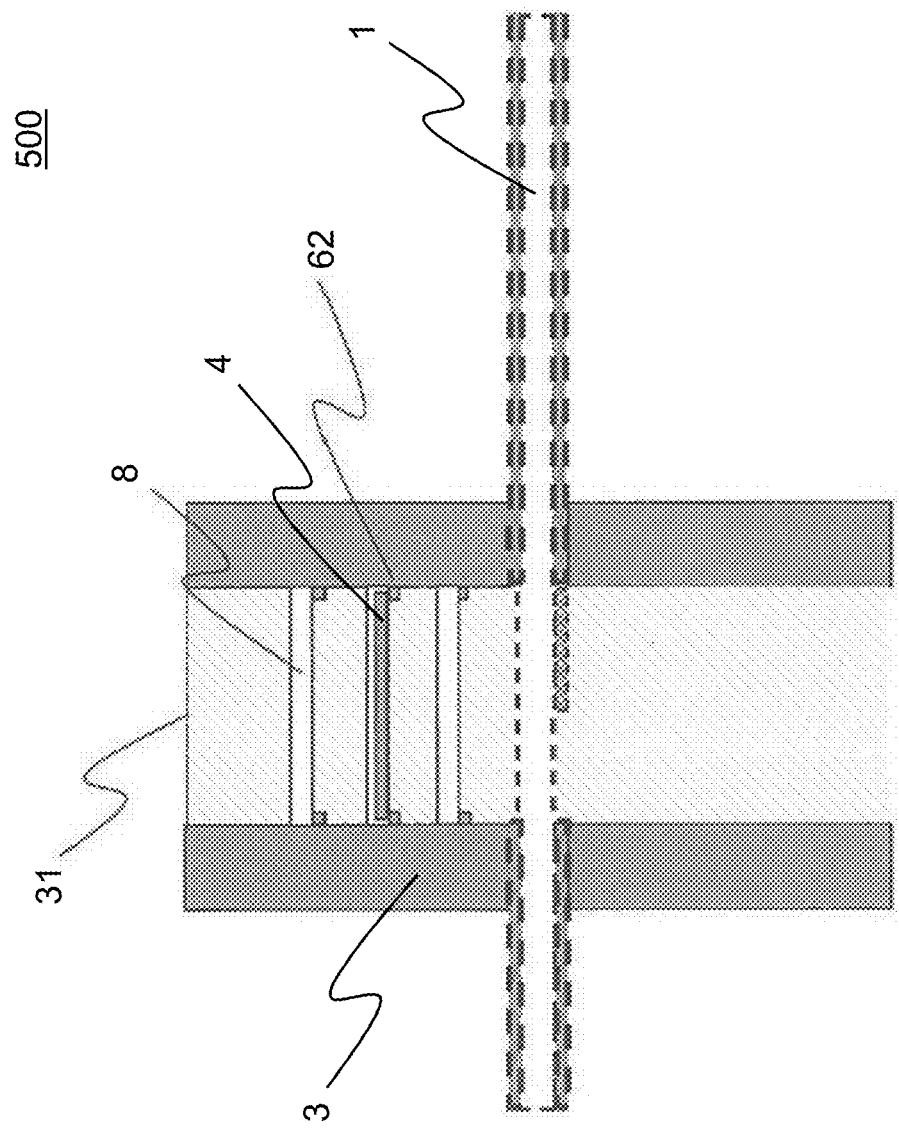
FIG. 6A is a cross-sectional view on a short edge side illustrating a structure of a waveguide converter of a fifth exemplary embodiment of the invention.
Figure 6B:
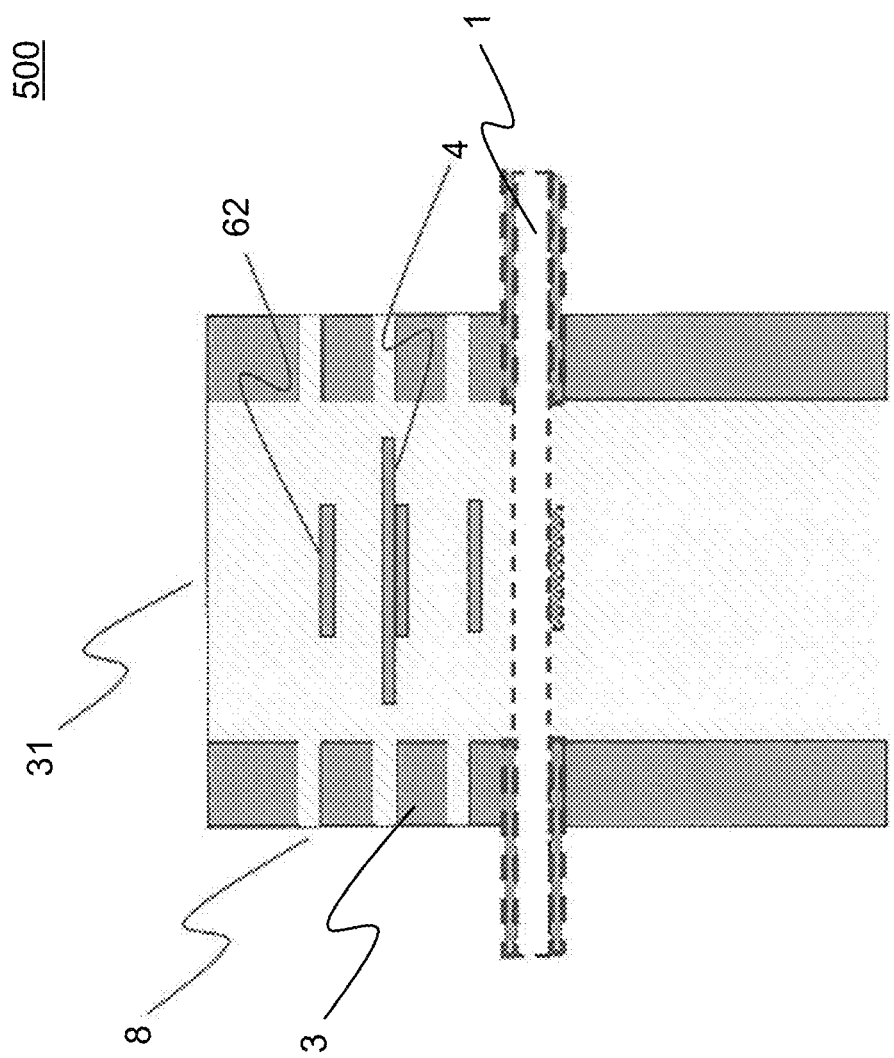
FIG. 6B is a cross-sectional view on a long edge side illustrating a structure of a waveguide converter of a fifth exemplary embodiment of the invention.

FIGS. 6A and/or 6B is a cross-sectional view illustrating a structure of a waveguide converter of a fifth exemplary embodiment of the invention. FIG. 6A is a cross-sectional view on a short edge side and FIG. 6B is a cross-sectional view on a long edge side. A structure of a waveguide converter 500 of the exemplary embodiment differs in that a slit 8 which is a long and narrow opening is formed in the terminal waveguide 3 and an end of the terminal waveguide 3 is not a short-circuit face but an opening face 31 from the structure of the waveguide converter 310 of another structure of the third exemplary embodiment. The waveguide converter 500 of the exemplary embodiment has a structure in which the slit 8 is formed at the same position as the position of the convex portion which is formed on the short edges side or the long edge side of the terminal waveguide 3 and arranged on a side face portion orthogonal to the side face on which the convex portion is formed. The conductor plate 4 is inserted from the slit 8 into the convex portion which is formed on the both inside walls of the terminal waveguide 3 which leads to the slit 8. Finally, the conductor plate 4 is held by any one of the convex portions to be engaged. The engagement mechanism 62 further including the slit 8 changes the distance between the conductor plate 4 and the printed wiring board 1 in stages. The waveguide converter 500 therefore obtains operations and effects similar to those of the waveguide converter 310 depicted in FIG. 4. Effects are further obtained, in which the conductor plate 4 is easily detached and an arrangement position is easily adjusted.

The present invention is not limited to the above exemplary embodiments and various modifications within the inventions described in the claims are able to be performed. The modifications are properly included in the scope of the invention.

REFERENCE SIGNS LIST

1 printed wiring board
2 waveguide
3 terminal waveguide
4 conductor plate
5 adjustment mechanism
6, 61, 62 engagement mechanism
7, 72 semi-fixing mechanism
8 slit
11 antenna
31 opening face
41 short-circuit face
100, 200, 300, 310, 400, 500 waveguide converter

The invention claimed is:

1. A waveguide converter, comprising;
a waveguide that introduces microwaves to an antenna that performs input and output in a planar microwave circuit,
a terminal waveguide that faces the waveguide with the antenna interposed therebetween and that terminates by being connected to the waveguide; and
a conductor plate mounted so as to face the antenna,
wherein the conductor plate is electrically connected to at least part of an inside wall of the terminal waveguide,
an adjustment mechanism for adjusting a distance between the conductor plate and the antenna,
wherein the adjustment mechanism is a plurality of concave portion formed on the inside wall of the terminal waveguide and engaging the conductor plate.

2. The waveguide converter of claim 1, wherein an electrical path for the microwaves is not formed between the conductor plate and a terminal face of the terminal waveguide.

3. The waveguide converter of claim 1, wherein the conductor plate is a short-circuited end with respect to the microwaves in the terminal waveguide.

4. A waveguide converter, comprising;
a waveguide that introduces microwaves to an antenna that performs input and output in a planar microwave circuit,
a terminal waveguide that faces the waveguide with the antenna interposed therebetween and that terminates by being connected to the waveguide; and
a conductor plate mounted so as to face the antenna,
wherein the conductor plate is electrically connected to at least part of an inside wall of the terminal waveguide,
an adjustment mechanism for adjusting a distance between the conductor plate and the antenna,
wherein the adjustment mechanism is a convex portion that is formed on a part of an inside wall of the terminal waveguide.

5. The waveguide converter of claim 4, wherein the terminal waveguide includes an opening in the inside wall through which the conductor plate is taken out of the terminal waveguide.

6. A waveguide conversion method, comprising:
introducing microwaves toward an antenna performing input and output in a planar microwave circuit;
terminating the microwaves that pass through the antenna by a conductor plate and reflecting the microwaves; and
making a distance between the conductor plate and the antenna variable, adjusting the distance between the conductor plate and the antenna by using a plurality of concave portion formed on an inside wall of a terminal waveguide and engaging the conductor plate.

* * * * *